US007640479B2

(12) United States Patent
Shen

(10) Patent No.: US 7,640,479 B2
(45) Date of Patent: Dec. 29, 2009

(54) SINGLE ENGINE TURBO DECODER WITH SINGLE FRAME SIZE BUFFER FOR INTERLEAVING/DEINTERLEAVING

(75) Inventor: Qiang Shen, San Diego, CA (US)

(73) Assignee: LSI Corporation, Milpitas, CA (US)

( * ) Notice: Subject to any disclaimer, the term of this patent is extended or adjusted under 35 U.S.C. 154(b) by 170 days.

(21) Appl. No.: 12/074,380

(22) Filed: Mar. 3, 2008

(65) Prior Publication Data
US 2008/0222484 A1  Sep. 11, 2008

Related U.S. Application Data

(60) Division of application No. 10/729,110, filed on Dec. 5, 2003, now Pat. No. 7,340,664, which is a continuation-in-part of application No. 09/668,059, filed on Sep. 20, 2000, now abandoned.

(51) Int. Cl.
*H03M 13/00* (2006.01)

(52) U.S. Cl. ............... 714/755; 714/788; 714/762; 714/786; 711/157

(58) Field of Classification Search ............... 714/755, 714/786, 788, 762; 711/157
See application file for complete search history.

(56) References Cited

U.S. PATENT DOCUMENTS

| | | | |
|---|---|---|---|
| 4,394,753 A | 7/1983 | Penzel | |
| 4,868,828 A * | 9/1989 | Shao et al. | ............... 714/704 |
| 5,063,533 A | 11/1991 | Erhart et al. | |
| 5,446,747 A | 8/1995 | Berrou | |
| 5,483,541 A | 1/1996 | Linsky | |
| 6,014,411 A | 1/2000 | Wang | |
| 6,028,899 A * | 2/2000 | Petersen | ............... 375/341 |
| 6,144,604 A | 11/2000 | Haller et al. | |
| 6,359,938 B1 | 3/2002 | Keevill et al. | |
| 6,442,728 B1 | 8/2002 | Cui et al. | |
| 6,516,437 B1 | 2/2003 | Van Stralen et al. | |
| 6,526,539 B1 | 2/2003 | Yano et al. | |
| 6,530,059 B1 * | 3/2003 | Crozier et al. | ............... 714/786 |
| 6,580,767 B1 * | 6/2003 | Koehler et al. | ............... 375/341 |
| 6,631,491 B1 | 10/2003 | Shibutani et al. | |
| 7,000,169 B2 | 2/2006 | Shen | |
| 7,340,664 B2 | 3/2008 | Shen | |

OTHER PUBLICATIONS

Gandhi, Dipakkumar, B., Office Action received from USPTO dated Apr. 11, 2003 for related U.S. Appl. No. 09/668,059, 5 pgs.
Gandhi, Dipakkumar, Office Action received from USPTO dated Jul. 21, 2003 for related U.S. Appl. No. 09/668,059, 10 pgs.

(Continued)

*Primary Examiner*—Guy J Lamarre
(74) *Attorney, Agent, or Firm*—James W. Huffman

(57) ABSTRACT

A method and apparatus for decoding and de-interleaving a received encoded and interleaved signal, the method employing and the apparatus including a single decoder coupled to a common buffer, the common buffer size equal to a frame of the received signal and the method further employing, and the apparatus further including, an address controller that causes data to be de-interleaved when read from the buffer and data to be interleaved when written to the buffer.

20 Claims, 8 Drawing Sheets

OTHER PUBLICATIONS

Shen, Qiang, Specification as filed in the USPTO for the divisional U.S. Appl. No. 10/691,078, Oct. 21, 2003, including drawings, 22 pgs.

Shen, Qiang, Preliminary Amendment filed in the USPTO for U.S. Appl. No. 10/691,078 on Oct. 21, 2003 (filed with application), pp. 1-10.

Gandhi, Dipakkumar, Office Action received from USPTO dated Sep. 30, 2004 for related U.S. Appl. No. 10/691,078, 14 pgs.

Shen, Qiang, Amendment/Response to Office Action filed in USPTO dated Dec. 20, 2004 for related U.S. Appl. No. 10/691,078, 8 pgs.

Gandhi, Dipakkumar, Notice of Allowance received from USPTO dated Jun. 16, 2005 for related U.S. Appl. No. 10/691,078, 4 pgs.

Lamarre, Guy, Office Action received from USPTO dated Jan. 17, 2007 for related U.S. Appl. No. 10/729,110, 8 pgs.

Shen, Qiang, Amendment filed in the USPTO dated May 17, 2007 for related U.S. Appl. No. 10/729,110, 14 pgs.

Lamarre, Guy, Office Action received from USPTO dated Aug. 3, 2007 for related U.S. Appl. No. 10/729,110, 6 pgs.

Shen, Qiang, Response filed in the USPTO dated Sep. 4, 2007 for related U.S. Appl. No. 10/729,110, 2 pgs.

Lamarre, Guy, Notice of Allowance and Examiner-Initiated Interview Summary eceived from USPTO dated Oct. 2, 2007 for related U.S. Appl. No. 10/729,110, 7 pgs.

Shen, Qiang, Comments on Examiner's Statement of Reasons for Allowance received from USPTO dated Jan. 2, 2008 for related U.S. Appl. No. 10/729,100, 2 pgs.

Claude Berrou, "New Optimum Error Correcting Coding and Decoding: Turbo-Codes", IEEE Transactions on Communications, vol. 44, No. 10, published Oct. 1996, p. 1261-1271.

Heegard, et al., "Turbo Coding", Chapter 3, pp. 39-40, pp. 44-46, Kluwer Academic Publishers, 1999.

Fung, Mike, "The Supertek S-1 Mini-Supercomputer", Compcon Spring '88, Third-Third IEEE Computer Society International Conference, Digest of Papers, Feb. 29-Mar. 3, 1988, pp. 116-118 especially abstract and Suptertek S-1 Functional Block Diagram, May 1988.

\* cited by examiner

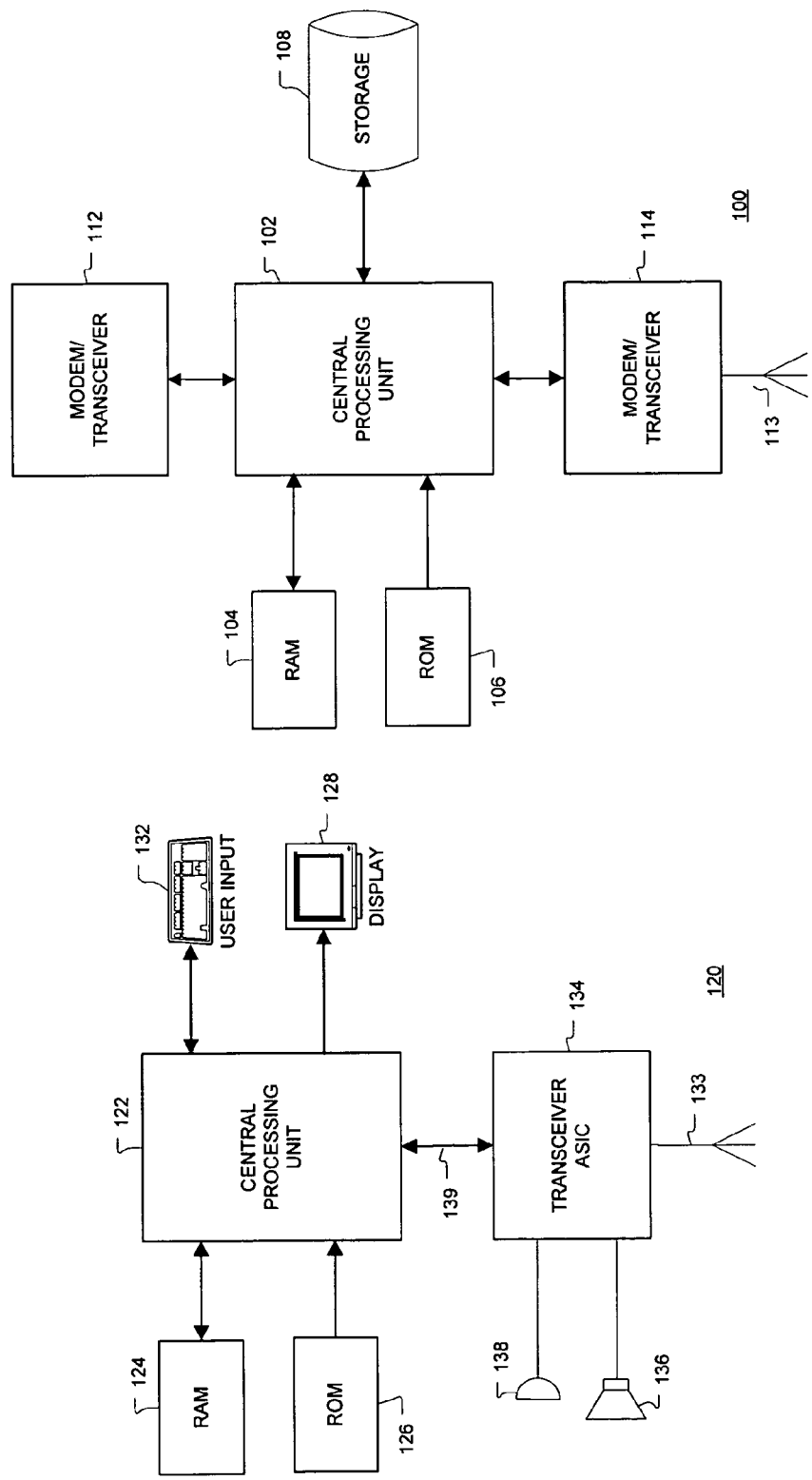

US 7,640,479 B2

SINGLE ENGINE TURBO DECODER WITH SINGLE FRAME SIZE BUFFER FOR INTERLEAVING/DEINTERLEAVING

CROSS REFERENCE TO RELATED APPLICATIONS

This application claims the benefit of 35 USC §120 as a divisional application of U.S. application Ser. No. 10/729,110 "Single Engine Turbo Decoder with Single Frame Size Buffer for Interleaving/Deinterleaving" filed Dec. 5, 2003 now U.S. Pat. No. 7,340,664, which in turn claims the benefit of 35 USC §120 as a continuation-in-part of Utility patent application Ser. No. 09/668,059 "Turbo Decoding" filed Sep. 20, 2000 now abandoned, and both of these applications are hereby incorporated herein in their entireties by reference.

BACKGROUND

1. Field of the Invention

The invention relates generally to forward error correction and de-interleaver methods and apparatus in mobile communication networks, and more particularly, to a memory usage optimization of forward error correction and de-interleaver method and apparatus in mobile cellular communication networks.

2. Description of Related Art

In mobile cellular communication networks a forward error correction ("FEC") component is commonly determined and added to signals communicated between base stations and mobile units in the networks. In addition, the signal is commonly interleaved prior to transmission to reduce the effect of possible burst errors in the network. A mobile unit or base station receiving an interleaved signal with added FEC components must decode and de-interleave the signal. When concatenated code (turbo code) is used for FEC, the mobile unit employs a turbo decoder to process the code where the turbo decoder internally performs interleaving and de-interleaving. The turbo decoder commonly requires a large, energy inefficient memory. These inefficient memories increase integrated circuit (IC) real estate (i.e., chip area) and power consumption of the mobile unit.

A need thus exists for a mobile unit based FEC decoder and de-interleaver system and method that requires small power-efficient memory. The present invention provides such a mobile unit based FEC decoder and de-interleaver system and method.

SUMMARY OF THE INVENTION

The present invention includes an apparatus for and a method of decoding and deinterleaving a received signal, the received signal encoded with two constituent codes and interleaved on a frame by frame basis. The apparatus may include a single constituent code decoder and a single common buffer coupled to the single constituent code decoder where the common buffer sized to hold a single frame of received data. The apparatus may further include an address controller coupled to the single common buffer where the address controller generates read addresses that causes data to be de-interleaved when read from the common buffer. In one embodiment the address controller may also generate write addresses that cause data to be interleaved when written to the common buffer. In another embodiment, the common buffer may be divided into a plurality of sub-buffers where each sub-buffer is a single port memory.

In an embodiment, the address controller may be configured to generate a read address for one of the plurality of sub-buffers and a write address for another of the plurality of sub-buffers, where the reading and writing of the respective sub-buffers occurs during the same clock cycle. The common buffer may also be divided into at least three sub-buffers where each sub-buffer is a single port memory. In this embodiment, the address controller may be configured to generate a read address for one of the sub-buffers and a write address for another of the plurality of sub-buffers so that the reading and writing of the respective sub-buffers occurs during the same clock cycle, and so that the remaining sub-buffers are idle during the same clock cycle. The address controller may be configured to generate read addresses using a one of a row-by-row with column shuffling algorithm and a column-by-column with row shuffling algorithm.

A method of the present invention may serially decode the received signal and store received data and decoded data in a single common buffer where the common buffer is sized to hold a single frame of received data. The method may also generate read addresses that cause data to be de-interleaved when read from the common buffer. In another method, the read and write addresses can be generated such that the data interleaving or de-interleaving can be achieved by the combination of writing to the common buffer and reading from that buffer.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein:

FIG. 2 is a block diagram of an exemplary base station that may be used to practice the present invention.

FIG. 3 is a block diagram of an exemplary mobile unit that may be used to practice the present invention.

DETAILED DESCRIPTION

Throughout this description, embodiments and variations are described for the purpose of illustrating uses and implementations of the invention. The illustrative description should be understood as presenting examples of the invention, rather than as limiting the scope of the invention.

Figure 1:
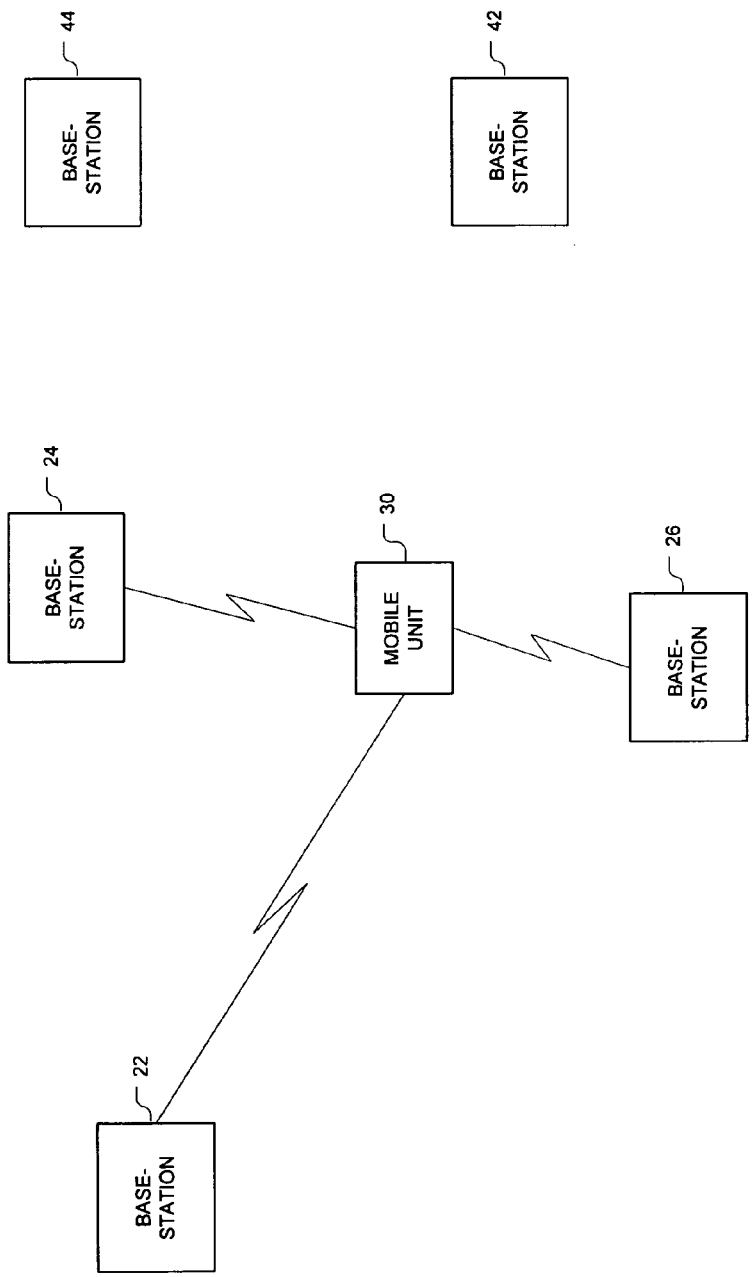
FIG. 1 is a block diagram of a cellular communication system comprising a plurality of base stations that may be used to practice the present invention.

FIG. 1 is a block diagram of a cellular system segment 10 in which the present invention may be employed. In this cellular system segment 10, there are a plurality of base stations 22, 24, 26, 42, and 44 that are geographically separated. The cellular system segment 10 also includes a mobile unit 30. The mobile unit may be any wireless apparatus, including a cellular Modulator/Demodulator ("modem") that may communicate with a base station (BS) 22, 24, 26, 42, or 46. For example, the mobile unit may be a cellular telephone, personal data assistant (PDA), or computer. In one embodiment, each base station may communicate with the mobile unit when the signal strength of the mobile unit, as received at a base station, is sufficiently strong. In one embodiment, the base stations support the same wireless communication protocol standard (such as a third generation (3G) Code Division Multiple Access (CDMA) standard). In another embodiment of the invention, the base stations may support different or multiple communication protocol standards. In addition, the mobile unit 30 may support a single or multiple communication protocol standards. For example, the device 30 may support a CDMA standard, Advanced Mobile Phone Service (AMPS) standard, a Time Division Multiple Access (TDMA) standard, and a Groupe Spécial Mobile (GSM) standard. In the example shown in FIG. 1, the mobile unit 30 is capable of communicating with all of the base stations 22, 24, 26, 42, or 44 using a 3G CDMA standard.

In FIG. 1, after acquiring a pilot signal from a base station 22, 24, and 26, the mobile unit 30 may communicate with the base station. Under the 3G CDMA standard, a base station may produce an interleaved, FEC encoded signal and transmit this signal to the mobile unit 30. The mobile unit 30 would de-interleave and decode the signal from the 3G CDMA standard compliant base station.

FIG. 2 illustrates a block diagram of an exemplary base station 100 that may be used in practicing the present invention. The exemplary base station 100 may include a CPU 102, a RAM 104, a ROM 106, a storage unit 108, an antenna 113, a first modem/transceiver 112 and a second modem/transceiver 114. The first modem/transceiver 112 may couple, in a well-known manner, the base station 100 to a central cellular network control center via an Internet connection or via a wired telephone system such as the Plain Old Telephone System ("POTS"). The second modem/transceiver 114 may couple the base station 100 to the cellular network segment 10. The modem/transceiver 114 may be an Ethernet modem, telephone modem, wireless modem or other communication device that communicates with the cellular network 10 (FIG. 1) via the antenna 113. The CPU 102 directs communications between the first and second modem, 112 and 114, respectively, for messages between the central network control center, Internet, or POTS, and one or more mobile units.

The ROM 106 may store program instructions to be executed by the CPU 102. The RAM 104 may be used to store temporary program information and overhead information for other base stations in its sector (i.e., nearby base stations). The storage unit 108 may comprise any convenient form of data storage and may be used to store the overhead information. An exemplary portion of the modem/transceiver 114 is shown in FIG. 4.

Figure 4:
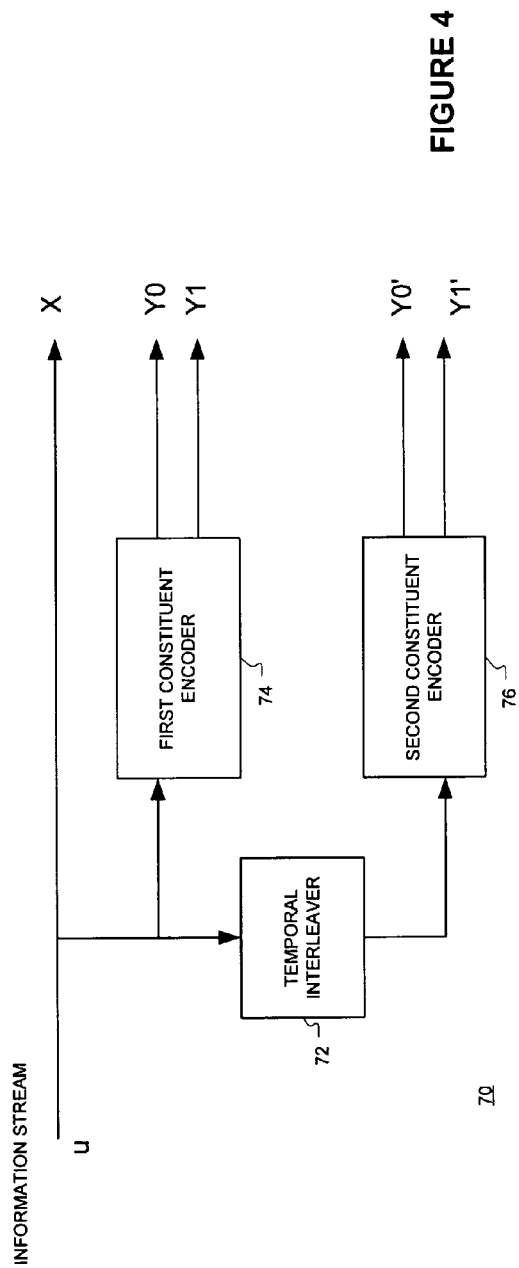
FIG. 4 is a simplified block diagram of an exemplary base station error encoder and interleaver that may be used to practice the present invention.

FIG. 4 is a simplified block diagram of an exemplary base station error encoder and interleaver apparatus 70 that may be used to practice the present invention.

In the 3G CDMA standard, the FEC encoder and interleaver form a turbo coder/decoder ("codec") that is employed by base stations and mobile units. The exemplary apparatus 70 is a turbo codec that includes a temporal interleaver 72, a first constituent encoder 74, and a second constituent encoder 76. In the apparatus 70, the FEC is comprised of two constituent systematic codes with a ⅓ coding rate whereby four parity check bits are generated for each information bit. The temporal interleaver 72 is employed before the second constituent encoder 76. The temporal interleaver 72 may be a turbo interleaver in an exemplary embodiment. In other embodiments, the apparatus 70 may have more than two constituent encoders and more than one temporal interleaver. In addition, other configurations, such as serial concatenation of these components 72, 74, and 76 may be employed in another embodiment of the invention.

FIG. 3 is a block diagram of an exemplary mobile unit 120 that may be used to practice the present invention, in particular, that may be used to de-interleave and decode received FEC encoded, interleaved signals. The exemplary device 120 may include a central processing unit (CPU) 122, a random access memory (RAM) 124, a read only memory (ROM) 126, a display 128, a user-input device 132, a transceiver application specific integrated circuit (ASIC) 134, a microphone 138, a speaker 136, and an antenna 133. The ROM 126 is coupled to the CPU 122 and stores the program instructions executed by the CPU 122. The RAM 124 is coupled to the CPU 122 and stores temporary program data and overhead information. The user-input device 132 may comprise any convenient input device such as a keypad, touch pad screen, track ball or other similar input device that allows the user to navigate through menus in order to place calls, in addition to performing other functions. The display 128 is an output device such as a CRT, LCD or other similar screen display that enables the user to read received data and to place calls.

The microphone 138 and speaker 136 may be incorporated into a handset that is coupled to the ASIC 134. The microphone 138 and speaker 136 may also be separated from the handset to allow hands-free communication. In this mode, the ASIC 134 may include voice activation circuitry that converts voice commands into data. The data is transmitted to the CPU 122 via a serial bus 139 and may include a telephone number to be dialed.

The transceiver ASIC 134 includes an instruction set necessary to communicate data and voice signals over the cellular network segment 10 (FIG. 1). In one embodiment, the transceiver ASIC 134 is a 3G code-division multiple-access (CDMA) ASIC and the cellular network is a CDMA network that supports data and voice communication. The ASIC 134 is coupled to the antenna 133 to communicate signals within the cellular network segment 10. When a data signal is received by the transceiver ASIC 134, the data is transferred to the CPU 122 via the serial bus 139. The ASIC 134 may perform operations to de-interleave and decode received interleaved, FEC-encoded signals. An exemplary portion of the ASIC 134 is shown in FIG. 5A.

Figure 5A:
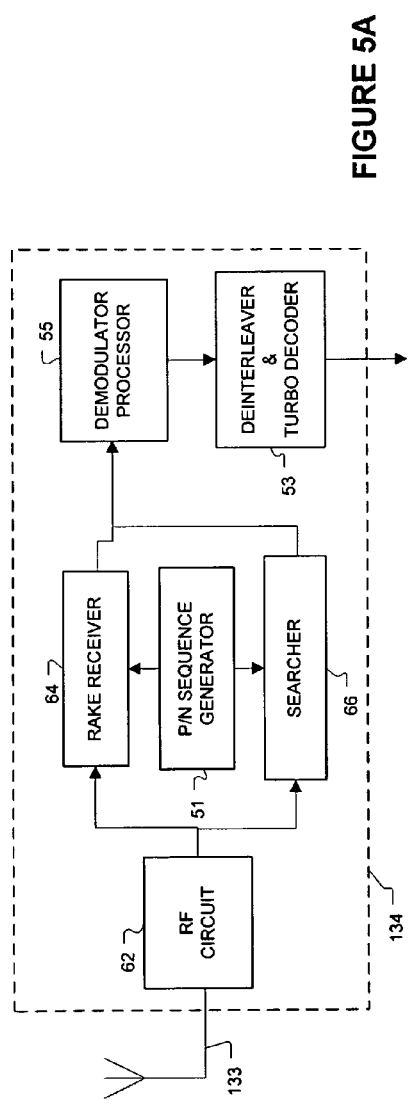
FIG. 5A is a block diagram of an exemplary mobile unit transceiver ASIC segment that may be used to practice the present invention.

As shown in FIG. 5A, the exemplary ASIC 134 includes a radio frequency (RF) circuit 62, a Rake receiver 64, a searcher correlator 66, a P/N sequence generator 51, a demodulator processor 55, and a deinterleaver & Turbo decoder 53. These components, 51, 53, 55, 62, 64, and 66 for CDMA mobile units are well known to those of skill in the wireless communications arts.

Figure 5B:
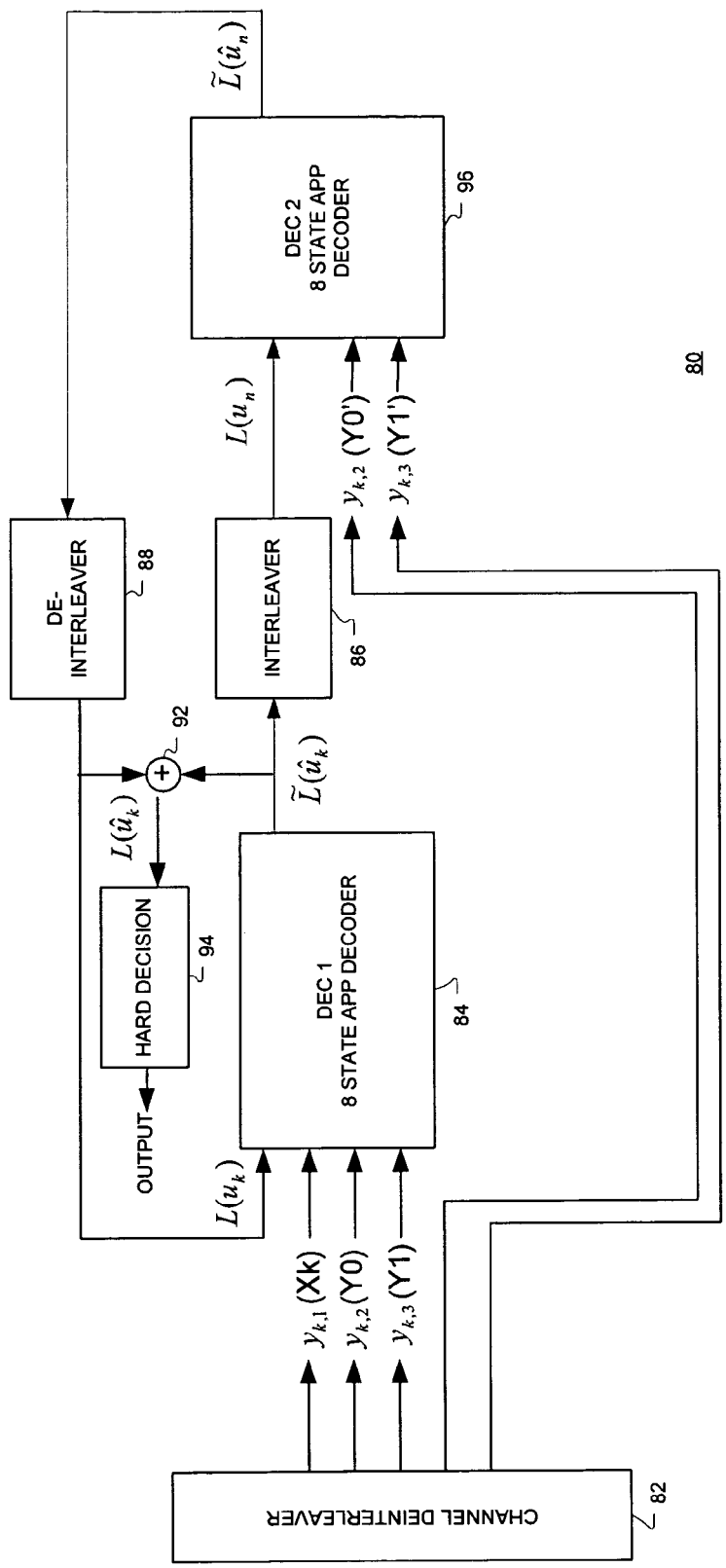
FIG. 5B is a block diagram of a mobile unit de-interleaver and error decoder that may be employed in the transceiver ASIC shown in FIG. 5A.

FIG. 5B is a block diagram of a mobile unit deinterleaver and error decoder apparatus 80 that may be employed in the transceiver ASIC shown in FIG. 5A for a CDMA based system. The mobile unit deinterleaver and error decoder apparatus 80 includes a channel deinterleaver 82, a first and a second A Posteriori Probability ("APP") decoder 84 and 96, respectively, an interleaver buffer 86, a deinterleaver buffer 88, an adder 92, and a hard decision unit 94. The channel deinterleaver 82 stores received FEC-encoded, interleaved data. The first and second decoders 84 and 96, respectively, operate recursively by feeding the output of the second decoder 96 to the input of the first decoder 84. The apparatus 80 is thus an iterative decoder. The interleaver buffer 86 stores the data generated by the first APP decoder 84. The deinterleaver buffer 88 stores the data generated by the second APP decoder 96.

The memory size used by the buffer varies as a function of the channel rate and encoding rate used. For example, for a CDMA IS-2000 standard based supplemental channel operating at 153.6 kbps, encoded at ¼ rate, where each APP decoder output comprises 8 bits, the total buffer (or memory) size of 86 and 88 comprises 6 Kbytes (i.e., 2 (buffers)×153.6 (kbps)×20 (ms)×8 (bits)=6 Kbytes). In the apparatus 80, the interleaver buffer 86 and the deinterleaver buffer 88 represent the major memory requirement of the apparatus. Turbo codes are usually implemented for high data rate, which translates to a large memory requirement. Therefore, proper design of the interleaver and deinterleaver in a turbo decoder is crucial to the size of the modem IC. Also, because of the iterative decoding needed for decoding turbo code, economic use of the decoding engine is also an important design issue. It is noted that memory power consumption levels vary as a function of the memory structure. In particular, a single read/write port memory structure is generally more power and IC real estate efficient than is a dual read/write port memory structure.

Figure 6A:
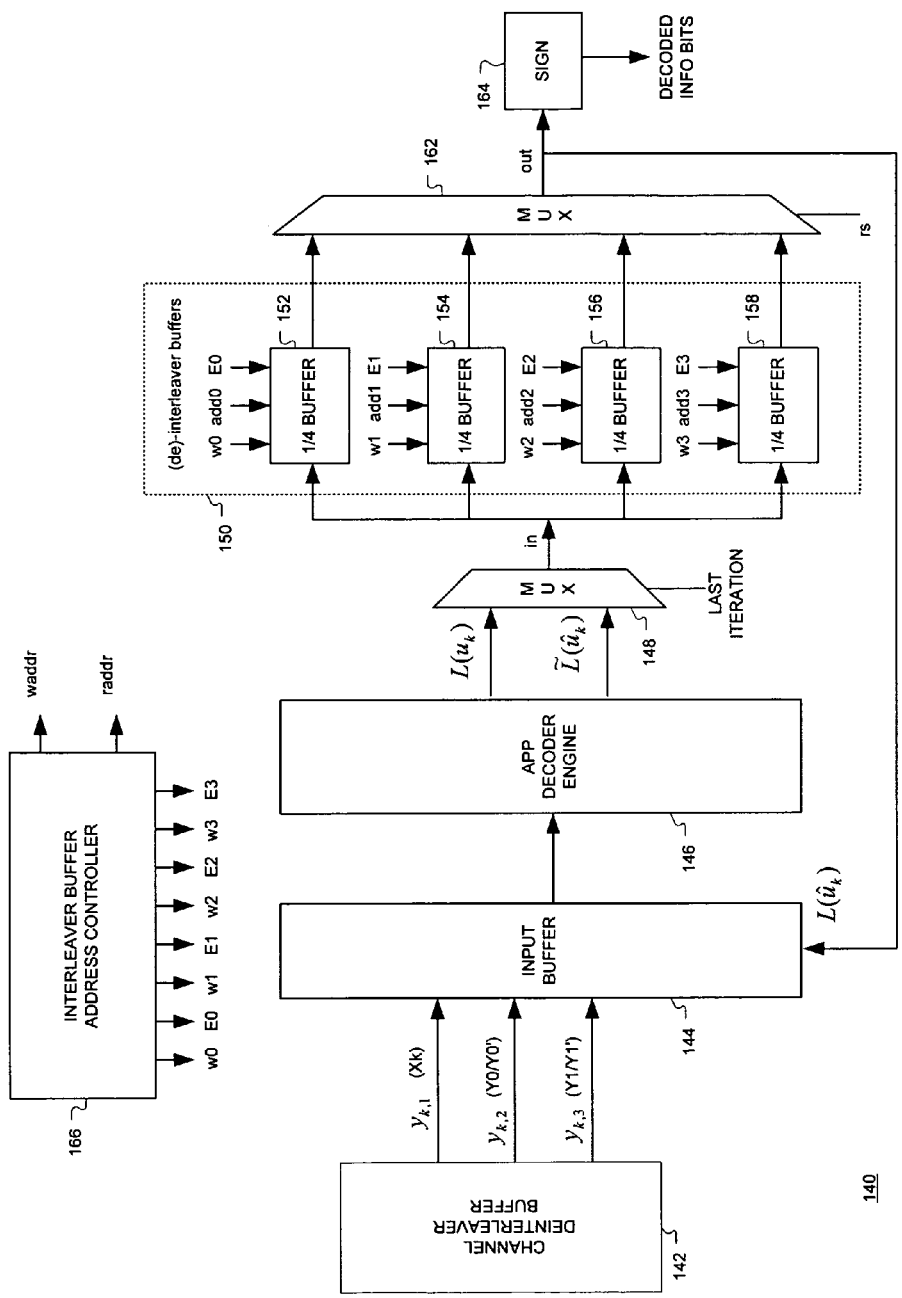
FIG. 6A is a block diagram of an exemplary mobile unit de-interleaver and error decoder that may be employed in the transceiver ASIC shown in FIG. 5A.

FIG. 6A is a block diagram of an exemplary mobile unit deinterleaver and error decoder apparatus 140 that may be employed in the transceiver ASIC shown in FIG. 5A. Similar to apparatus 80, apparatus 140 may be employed to decode and de-interleave received signals encoded with a ⅓ coding rate constituent codes. However, apparatus 140 may be modified for any coding rate. As shown in FIG. 6A, the apparatus 140 includes a channel deinterleaver buffer 142, an input buffer 144, a single APP decoder engine 146, a first multiplexer 148, a (de)interleaver memory 150, a second multiplexer 162, a sign coder 164, and an interleaver buffer address controller 166. The channel deinterleaver buffer 142 stores interleaved, FEC encoded data. The APP decoder engine 146 functions as the first and the second A Posteriori Probability ("APP") decoder 84 and 96 of FIG. 5B.

In the apparatus 140, the single APP decoder engine 146 and one information data estimation frame size buffer or memory 150 are used to decode a constituent code 1 and a constituent code 2. The channel deinterleaver buffer 142 stores all of the received turbo coded (FEC-encoded) symbols that are corrupted by the channel. The channel buffer 142 data is combined with data that is read from the (de)-interleaver buffer or memory 150 to form input to the APP decoder 146 via the input buffer 144. The decoder engine 146 calculates the a posteriori probability of each information data in a manner that is known to one of skill in the art. In particular, for each FEC or turbo error decoding iteration, the APP decoder engine 146 first decodes constituent code 1. Data deinterleaving prior to decoding is achieved by reading data from the (de)-interleaver buffer for use by the APP decoder engine 146 and writing constituent code 2 data to the (de)-interleaver buffer in the last iteration. The APP decoder engine 146 then decodes constituent code 2. Data interleaving is achieved by the combination of reading data from the (de)-interleaving buffer or memory 150 for use by the APP decoder engine 146 and then writing data generated by the APP decoder engine 146 to the (de)-interleaving buffer or memory 150 while decoding constituent code 1 in the last iteration.

Figure 7:
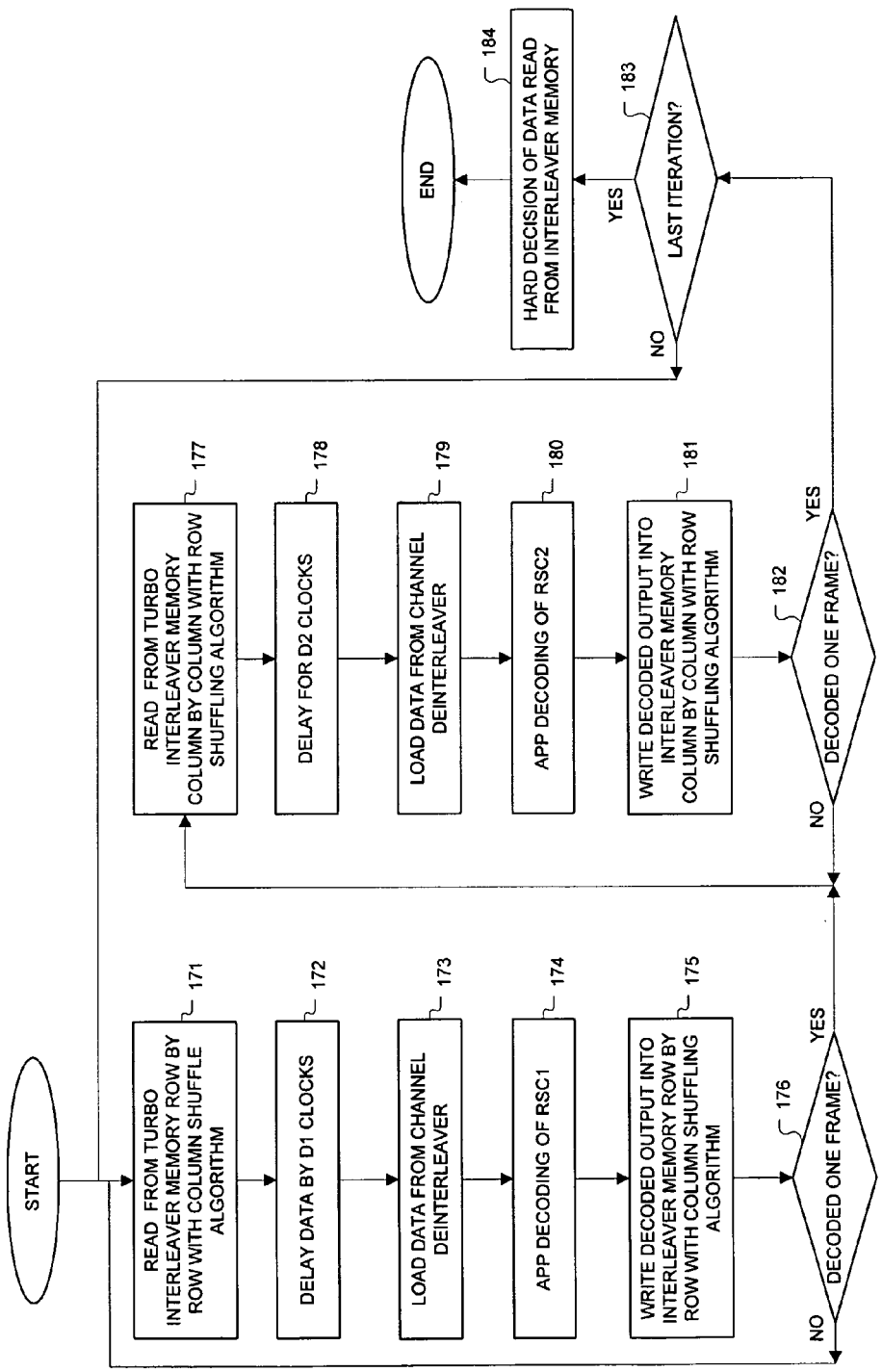
FIG. 7 depicts an exemplary process that may be used to de-interleave and decode a received interleaved, error encoded signal in accordance with the teachings of the present invention.

FIG. 7 depicts an exemplary process 170 that the apparatus 140 may perform when de-interleaving and decoding a received interleaved, error encoded signal in accordance with the teachings of the present invention. It is noted that the (de)-interleaving buffer or memory contains a single identical value, e.g., every address is cleared to 0 prior to the start of process 170. In step 171, data is read from the memory 150 by using a read address that is generated row-by-row with column shuffling, hereafter referred as a "horizontal addressing" algorithm. The data stream produced at step 171 is thereby effectively de-interleaved, i.e. in the original pre-interleaved order. Then the data is delayed by a fixed number of clock cycles D1 (step 172), where D1 is determined by the interleaving dimension and the decoding delay. The process 170 then retrieves data from the channel deinterleaver buffer 142 (step 173) so that retrieved channel deinterleaver buffer data, representing received coded symbols, is synchronized with the delayed data from the (de)-interleaving buffer/memory 150 (FIG. 6A). The first constituent code, 1 ("RSC1") is decoded (step 174) by processing data from the memory 150 (FIG. 6A) and from the channel deinterleaver buffer 142 (FIG. 6A) according to a constituent code 1 trellis. The decoded RSC1 data is written into the memory 150 on a row-by-row basis, with the column shuffling algorithm (step 175). Steps 171 through 175 are repeated until a complete frame has been processed (step 176).

Data is then read from the memory 150 using a read address that is generated on a column-by-column basis using a row shuffling algorithm (step 177). The data stream that is produced at this step (177) is effectively interleaved. The data is then delayed by a fixed number of clock cycles, D2 (step 178), where D2 is determined by the interleaving dimension and the decoding delay. D2 is generally not the same as D1 although in some embodiments it can be. The process 170 then retrieves data from the channel deinterleaver buffer 142 (step 179) so that retrieved channel deinterleaver buffer data, representing received coded symbols, is synchronized with the delayed data from the (de)-interleaving buffer/memory 150. The second constituent code (RSC2) is then decoded (step 180) by processing data received from the memory 150 and from the channel deinterleaver buffer 142 according to a constituent code 2 trellis. The decoded RSC2 data is written into memory 150 on a column-by-column basis, with the row shuffling algorithm (step 181). Steps 177 through 181, inclusive, are repeated until a complete frame has been processed (step 182). Steps 171 through 182 are then repeated until the last decoding iteration (step 183), in an exemplary embodiment, until the decoding iteration reaches a predetermined threshold number. A hard decision is then made between the computed data and the data stored in the memory 150 (step 184). Note that steps 171-175 (and steps 177-181) are only serially performed for a specific data symbol. During operation in a data symbol pipeline the steps 171-175 (and steps 177-181) may be performed contemporaneously.

The (de)interleaver memory 150 (FIG. 6A) includes four, equally sized sub-buffers or memories 152, 154, 156, and 158. In the exemplary embodiment, the total size of the memory 150 is equal to one information data estimation frame. During a decoding operation, the four sub-buffers 152, 154, 156, and 158 store information data estimations from a current decoding iteration or from a previous decoding iteration. In the apparatus 140, the APP decoder engine 146 operates continuously on the data in these buffers, i.e., without waiting for data to be interleaved or deinterleaved as in the apparatus 80. Data interleaving and de-interleaving is performed when information data estimation is saved and read from the memory 150 via addresses that are generated by the interleaver buffer address control unit 166. In the exemplary apparatus 140, the memory size is 3 KB (i.e., 153.6 (kbps)×20 (ms)×8 (bits), assuming that 8 bits represent each soft value of information data estimation. Accordingly, the apparatus 140 requires the half of the memory required by the apparatus 80 for information data estimation, i.e., 3 Kbytes versus 6 Kbytes.

It is noted that apparatus 140 achieves the memory size reduction regardless of whether the memory 150 is subdivided into four buffers. The subdivision of the Memory 150 in the exemplary apparatus 140, however, enables use of single read/write memory port types, which reduces power consumption and silicon real estate (as compared to dual memory port types). In particular, during operation of the apparatus 140, at any given time instance, only one sub-buffer is being read and only one sub-buffer is being written while the two other sub-buffers are disabled. The apparatus 140 may be used to implement any FEC or turbo coder that utilizes a matrix interleaver algorithm. In particular, the entire data frame that is to be interleaved is virtually arranged as a (row_number)×(column_number) buffer in memory 150, where "column_number" is a design parameter, "row_number"=ceiling(Frame_length/column_number), and "Frame_length" is the number of bits in the information data estimation frame.

Figures 6B, 6C:
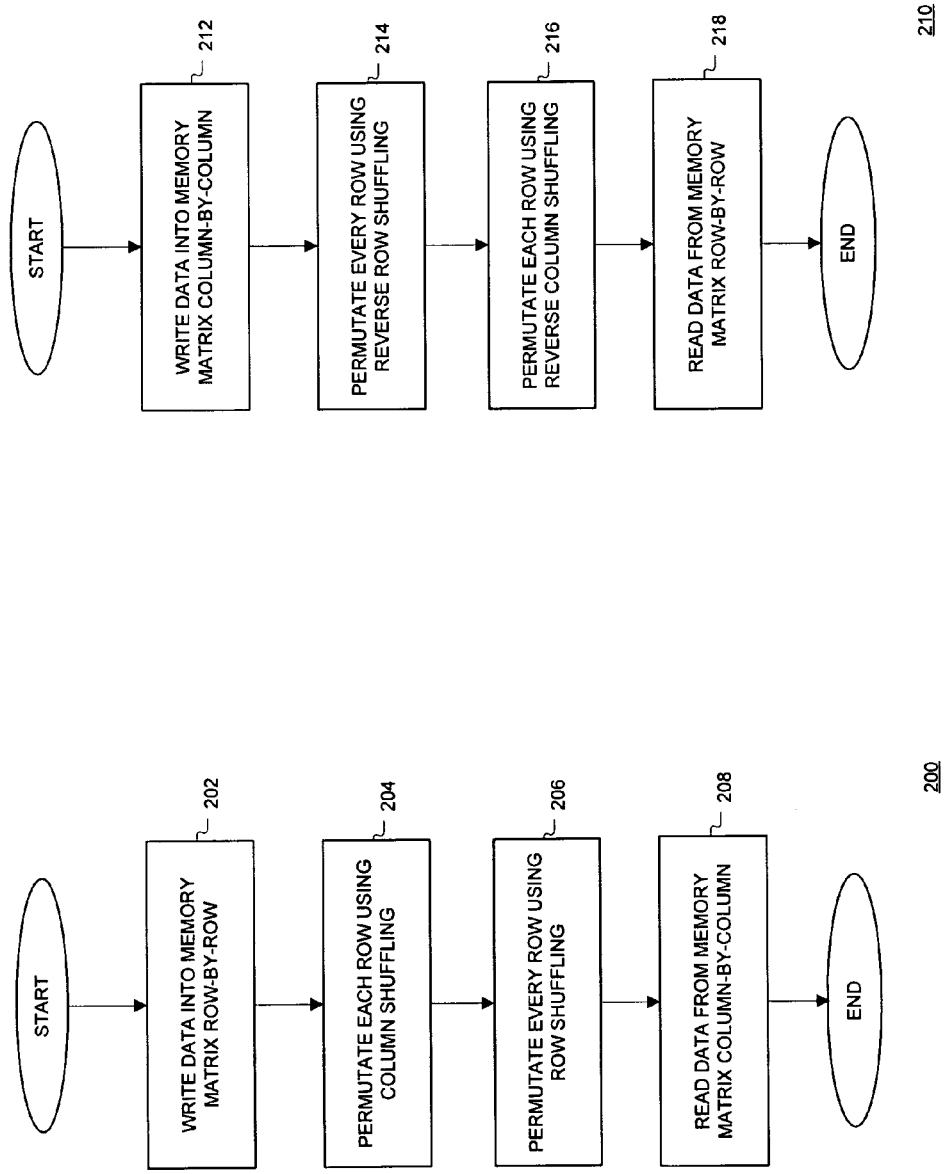
FIG. 6B depicts an exemplary interleaving process that may be used to interleave data when stored in a memory in accordance with the teachings of the present invention.
FIG. 6C depicts an exemplary de-interleaving process that may be used to deinterleave data when stored in a memory in accordance with the teachings of the present invention.

FIG. 6B depicts an exemplary interleaving process 200 that may be used to interleave data when the data is stored in the memory 150 in accordance with the teachings of the present invention. In the exemplary interleaving process 200, data is written into the memory matrix on a row-by-row basis (step 202). The content of each row is then permutated using a specific pattern, column shuffling in a CDMA IS-2000 based system (step 204). Then every row, as a whole, is permutated using another specific pattern, row shuffling in the CDMA IS-2000 based system (step 206). To complete the interleaving process 200, data is read from the memory matrix 150 on a column-by-column basis (step 208).

FIG. 6C depicts an exemplary de-interleaving process 210 that may be used to deinterleave data when the date is stored in the memory 150 in accordance with the teachings of the present invention. In the exemplary de-interleaving process 210, data is written into the memory matrix on a column-by-column basis (step 212). Every row, as a whole, is then permutated using another specific pattern, reverse row shuffling in the CDMA IS-2000 based system (step 214). The content of each row is then permutated using a specific pattern, reverse column shuffling in a CDMA IS-2000 based system (step 216). To complete the de-interleaving process 210, data is read from the memory matrix 150 on a row-by-row basis (step 218). It is noted that any specific column and row shuffling algorithm may be used in the present invention as a function of how the received data is/was interleaved.

In an exemplary embodiment, the interleaver buffer address controller 166 (shown in FIG. 6A) generates the read and write addresses used for turbo interleaving and deinterleaving. In one embodiment, the controller 166 generates addresses using two methods (processes 200 or 210 as described above with reference to FIGS. 6B and 6C) as a function of which constituent code the APP decoder is processing. In particular, when the APP decoder engine 146 (FIG. 6A) is decoding constituent code 1, the address controller 166 generates read and write addresses on a row-by-row basis, with column shuffling, as required by de-interleaving read and interleaving write (process 200 shown in FIG. 6B). When the APP decoder engine 146 is decoding constituent code 2, the address controller 166 generates read and write addresses on a column-by-column basis, with row shuffling, as required by interleaving read and de-interleaving write (process 210 shown in FIG. 6C). Alternatively, employing these methods (200 and 210) enables the address controller 166 to interleave information data estimations between the APP decoder engine code 1 output and the APP decoder engine code 2 input. Using these methods also allows the address controller 166 to deinterleave information data estimations between the APP decoder engine code 2 output and APP decoder engine 146 code 1 input.

In an exemplary embodiment, the single port memory may be used for the frame buffer or memory 150. In particular, in an exemplary embodiment, the memory 150 includes four, quarter frame size single port memories (152, 154, 156, and 158), In this embodiment, these memories may be employed provided that a specific delay between the buffer read and write cycles is selected and a specific process to generate read and write addresses is employed.

Figure 8:
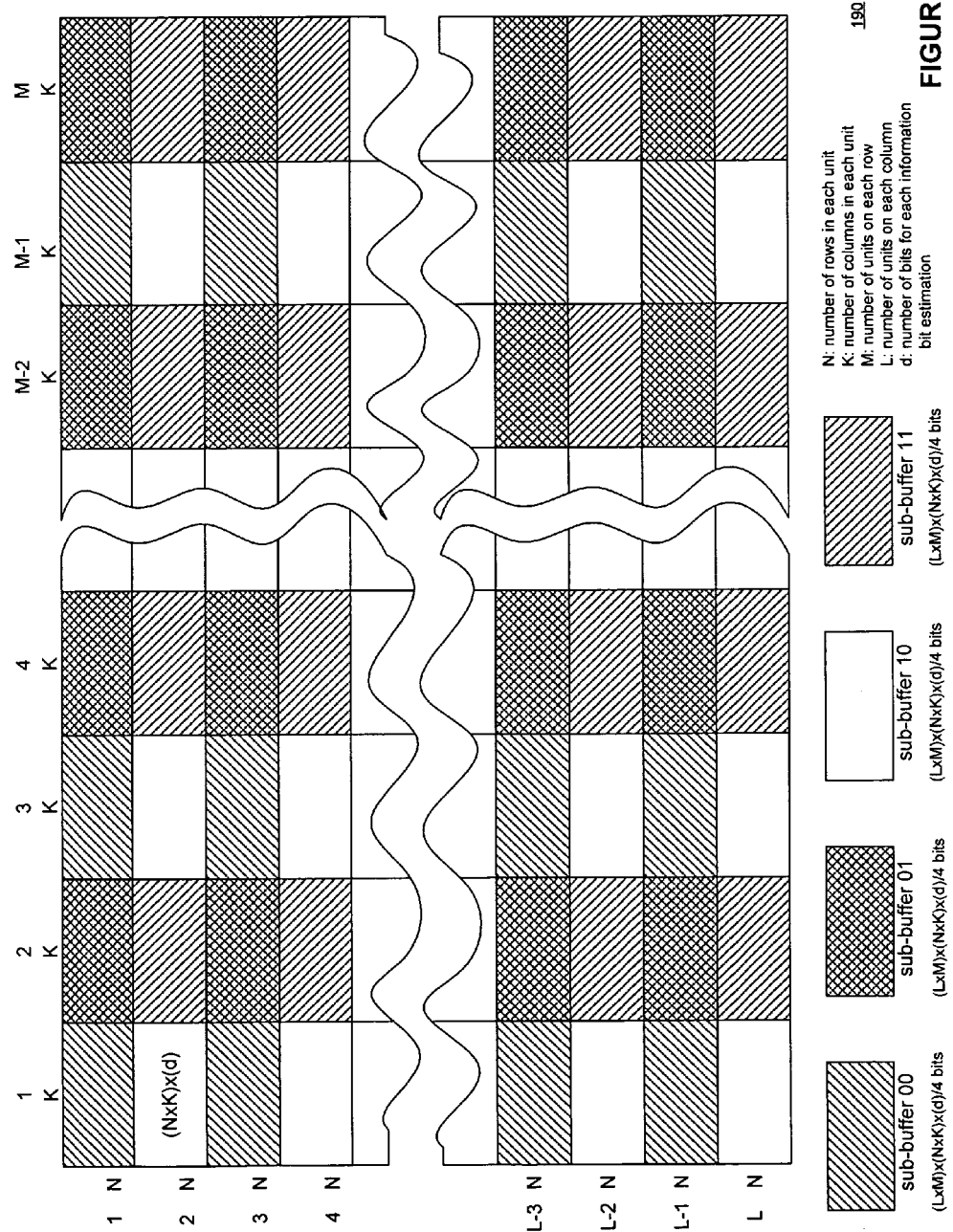
FIG. 8 is a diagram showing an exemplary memory mapping/layout for use by the apparatus shown in FIG. 6A and the process shown in FIG. 7.

FIG. 8 is a diagram of an exemplary memory mapping/layout 190 for use by the apparatus shown in FIG. 6A and the process depicted in FIG. 7. In this memory layout, the memory 150 is divided into four, quarter frame sub-buffers. In FIG. 8, the sub-buffers 00, 01, 10, and 11 are represented by four patterns. As shown in FIG. 8, the memory 150 is divided into N×K segments or units where there are L groups of N rows and M groups of K columns or L×M segments. In the exemplary memory layout 190, each sub-buffer is formed from non-adjacent row and non-adjacent column units or segments form one sub-buffer, resulting in 4 sub-buffers. Accordingly, each sub-buffer is physically separate from the other memories and may have a single address and a single port for reading or writing of data.

In an exemplary embodiment, the specific delay between the read and write cycles enables data reading and writing in two different, advantageously adjacent row or column groups. In particular, when horizontal (row-by-row) addresses are being generated, the data writing address is ideally N rows greater than the data reading address. In this addressing scheme, one of the sub-buffers 00 or 01 and one of sub-buffers 10 or 11, are either read or written. The other two sub-buffers are then idle. When vertical (column-by-column) addresses are being generated, the data writing address is K columns greater than the data reading address. In this addressing scheme, one of sub-buffers, 00 or 10, and one of sub-buffers 01 or 11, are either read or written. The other two sub-buffers are then idle.

The application of the memory layout 190 to the address controller 166 of FIG. 6A requires appropriate write and enable signal generation (w0, E0, w1, E1, w2, E2, w3, and E3) and read and write address generation ("raddr" and "waddr", respectively). For example for vertical addressing of sub-buffer 00 and sub-buffer 01 (when sub-buffer 00 (index 0) is read, sub-buffer 01 (index 1) is written, and sub-buffers 10 (index 2) and 11 (index 3) are idle, the signals generated by the address controller 166 may include: w0=1, w1=0, w2=0, w3=0; E0=1, E1=1, E2=0, E3=0; Add0=waddr (write address); Add1=raddr (read address); Add2=don't care; Add3=don't care; and RS (read selection)=1.

The selection of row, N and column, K of the sub-buffer is then based on the interleaving matrix dimension and decoding delay. In detail, a matrix dimension that may be modeled in the present invention may have $(2^{(n1+n2)})$ rows and $(2^{(m1+m2)})$ columns; where n1, n2, m1, and m2 are integer numbers greater than 0. In this example, the address for interleaver matrix is (n1+n2+m1+m2) bits in length, while the address for corresponding sub-buffers is accordingly ((n1+n2+m1+m2)−2) bits in length by properly extracting two address bits for sub-buffer selection. For example, when N and K are both odd numbers, the following method can be used. For an interleaver matrix address denoted as A1(n1+n2+m1+m2), . . . A(1), A(0), indexed row-by-row, from the first position in the first row, to the last position in the last row, the sub-buffer address is correspondingly obtained by removing A(n1+n2) and A(0). These two address bits form the binary index of the sub-buffer that is selected, i.e. when A(n1+n2), A(0)=1,0 sub-buffer 10 (index 2) is selected.

Different memory layouts may be selected as a function of the interleaving and FEC encoding process applied to the transmitted (received at the mobile unit) signal. For example, the above invention is extendable to other concatenated coding schemes including parallel concatenation and serial concatenation. The invention is also extendable to more than two component codes in the FEC-encoding scheme, and to more than one interleaving scheme. The same single APP decoder engine and single buffer architecture may be employed in these cases with appropriate modifications to control flow. In particular, the control flow may be expanded from two decoding stages to T stages, where T is equal to the number of constituent codes and the row shuffling and column shuffling algorithms may be modified to match interleaver algorithms employed at corresponding stages of encoding during the received signal generation (at a base station in one embodiment).

Thus, the previous description of the preferred embodiments is provided to enable any person skilled in the wireless communications art to make or use the present invention. The various modifications to these embodiments will be readily apparent to those skilled in the art, and the generic principles defined herein may be applied to other embodiments without the use of inventive faculty. Thus, the present invention is not intended to be limited to the embodiments shown herein, but is to be accorded the widest scope consistent with the principles and novel features disclosed herein.

While this invention has been described in terms of a best mode for achieving the objectives of the invention, it will be appreciated by those skilled in the wireless communications art that variations may be accomplished in view of these teachings without deviating from the spirit or scope of the present invention. For example, the present invention may be implemented using any combination of computer programming software, firmware or hardware. As a preparatory step to practicing the invention or constructing an apparatus according to the invention, the computer programming code (whether software or firmware) according to the invention will typically be stored in one or more machine readable storage mediums such as fixed (hard) drives, diskettes, optical disks, magnetic tape, semiconductor memories such as ROMs, PROMs, etc., thereby making an article of manufacture in accordance with the invention. The article of manufacture containing the computer programming code is used by either executing the code directly from the storage device, by copying the code from the storage device into another storage device such as a hard disk, RAM, etc., or by transmitting the code on a network for remote execution.

What is claimed is:

1. A method of decoding and de-interleaving a received signal representing a single frame of data, the received signal encoded with two constituent codes and interleaved on a frame by frame basis, the method comprising the steps of:
    serially decoding the received signal; and
    storing all received data of the frame that is partially decoded data in a single common buffer, the common buffer required to hold only one block of data, each representing a soft estimate of one bit, for each bit encoded in the single frame of received data.

2. The method of claim 1, further comprising the step of:
    a) generating read and write addresses that cause data to be de-interleaved when read from and written to the common buffer and generating read and write addresses that cause data to be interleaved when read from and written to the common buffer.

3. The method of claim 2, wherein step a) generates read and write addresses that cause data to be read from the common buffer row by row and to be written to the common buffer column by column to de-interleave the data and generates read and write addresses that cause data to be read from the common buffer column by column and to be written to the common buffer row by row to interleave the data.

4. The method of claim 3, wherein the common buffer is divided into a plurality of sub-buffers and each sub-buffer is a single port memory.

5. The method of claim 4, further comprising the step of generating a read address for one of the plurality of sub-buffers and a write address for another of the plurality of sub-buffers, the reading and writing of the respective sub-buffers occurring during the same clock cycle.

6. The method of claim 2, wherein step a) includes the step of employing a first algorithm to generate read addresses for the common buffer for data input to the constituent code decoder and contemporaneously employing the first algorithm to generate write addresses for the common buffer for data output from the constituent code decoder where the write addresses are offset by a predetermined number of rows from the read addresses when the decoder is decoding the first of the two constituent codes.

7. The method of claim 6, wherein step a) includes the step of employing a second algorithm to generate read addresses for the common buffer for data input to the constituent code decoder and contemporaneously employing the second algorithm to generate write addresses for the common buffer for data output from the constituent code decoder where the write addresses are offset by a predetermined number of columns from the read addresses when the decoder is decoding the second of the two constituent codes.

8. The method of claim 7, wherein the employment of the first algorithm to generate write addresses during the decoding of the first of the two constituent codes and employment of the second algorithm to generate read addresses during the decoding of the second of the two constituent codes interleaves the data and the employment of the second algorithm to generate write addresses during the decoding of the second of the two constituent codes and employment of the first algorithm to generate read addresses during the decoding of the first of the two constituent codes de-interleaves the data.

9. The method of claim 8, wherein step a) includes the step of generating read addresses using a one of a row-by-row with column shuffling algorithm and a column-by-column with row shuffling algorithm.

10. The method of claim 9, wherein the received signal is encoded with two constituent codes and interleaved based on a CDMA protocol and wherein the apparatus is employed in a mobile unit deployed within a CDMA-based communication system.

11. An article of manufacture for use in decoding and de-interleaving a received signal representing a single frame of data, the received signal encoded with two constituent codes and interleaved on a frame by frame basis, the article of manufacture comprising computer readable storage media including program logic embedded therein that causes control circuitry to perform the steps of:

serially decoding the received signal; and storing all received data of the frame that is partially decoded data in a single common buffer, the common buffer required to hold only one block of data, each representing a soft estimate of one bit, for each bit encoded in the single frame of received data.

12. The article of manufacture of claim 11, further performing the step of:

a) generating read and write addresses that cause data to be de-interleaved when read from and written to the common buffer and generating read and write addresses that cause data to be interleaved when read from and written to the common buffer.

13. The article of manufacture of claim 12, wherein step a) generates read and write addresses that cause data to be read from the common buffer row by row and to be written to the common buffer column by column to de-interleave the data and generates read and write addresses that cause data to be read from the common buffer column by column and to be written to the common buffer row by row to interleave the data.

14. The article of manufacture of claim 13, wherein the common buffer is divided into a plurality of sub-buffers and each sub-buffer is a single port memory.

15. The article of manufacture of claim 14, the further performing the step of generating a read address for one of the plurality of sub-buffers and a write address for another of the plurality of sub-buffers, the reading and writing of the respective sub-buffers occurring during the same clock cycle.

16. The article of manufacture of claim 12, wherein step a) includes the step of employing a first algorithm to generate read addresses for the common buffer for data input to the constituent code decoder and contemporaneously employing the first algorithm to generate write addresses for the common buffer for data output from the constituent code decoder where the write addresses are offset by a predetermined number of rows from the read addresses when the decoder is decoding the first of the two constituent codes.

17. The article of manufacture of claim 16, wherein step a) includes the step of employing a second algorithm to generate read addresses for the common buffer for data input to the constituent code decoder and contemporaneously employing the second algorithm to generate write addresses for the common buffer for data output from the constituent code decoder where the write addresses are offset by a predetermined number of columns from the read addresses when the decoder is decoding the second of the two constituent codes.

18. The article of manufacture of claim 17, wherein the employment of the first algorithm to generate write addresses during the decoding of the first of the two constituent codes and employment of the second algorithm to generate read addresses during the decoding of the second of the two constituent codes interleaves the data and the employment of the second algorithm to generate write addresses during the decoding of the second of the two constituent codes and employment of the first algorithm to generate read addresses during the decoding of the first of the two constituent codes de-interleaves the data.

19. The article of manufacture of claim 18, wherein step a) includes the step of generating read addresses using a one of a row-by-row with column shuffling algorithm and a column-by-column with row shuffling algorithm.

20. The article of manufacture of claim 19, wherein the received signal is encoded with two constituent codes and interleaved based on a CDMA protocol and wherein the apparatus is employed in a mobile unit deployed within a CDMA-based communication system.

* * * * *